United States Patent
Micheloni et al.

(10) Patent No.: US 6,944,072 B2
(45) Date of Patent: Sep. 13, 2005

(54) SELF-REPAIR METHOD FOR NONVOLATILE MEMORY DEVICES WITH ERASING/PROGRAMMING FAILURE, AND RELATIVE NONVOLATILE MEMORY DEVICE

(75) Inventors: Rino Micheloni, Turate (IT); Aldo Losavio, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 79 days.

(21) Appl. No.: 10/440,043

(22) Filed: May 15, 2003

(65) Prior Publication Data

US 2004/0008549 A1 Jan. 15, 2004

(30) Foreign Application Priority Data

May 21, 2002 (EP) ............................................ 02425319

(51) Int. Cl.[7] ............................................. G11C 29/00
(52) U.S. Cl. ............. 365/200; 365/185.09; 365/185.22; 365/185.29; 365/218
(58) Field of Search ........................... 365/200, 185.09, 365/185.22, 185.29, 218

(56) References Cited

U.S. PATENT DOCUMENTS

| | | | |
|---|---|---|---|
| 5,438,546 A | 8/1995 | Ishac et al. ................. | 365/200 |
| 5,682,349 A | 10/1997 | Campardo et al. ...... | 365/185.29 |
| 5,748,527 A | 5/1998 | Lee et al. .............. | 365/185.09 |
| 5,751,647 A | 5/1998 | O'Toole ...................... | 365/200 |
| 5,796,653 A | 8/1998 | Gaultier .................. | 365/185.09 |
| 5,818,791 A | 10/1998 | Tanaka et al. ......... | 365/230.06 |
| 5,909,390 A | 6/1999 | Harari .................... | 365/185.03 |
| 5,928,370 A | 7/1999 | Asnaashari .................. | 714/48 |
| 6,236,609 B1 * | 5/2001 | Tanzawa et al. ............ | 365/218 |
| 6,418,051 B2 | 7/2002 | Manstretta et al. .... | 365/185.09 |
| 6,442,080 B2 * | 8/2002 | Tanzawa et al. ....... | 365/189.09 |
| 6,459,628 B1 | 10/2002 | Bautista, Jr. et al. ....... | 365/194 |
| 6,498,752 B1 | 12/2002 | Hsu et al. .............. | 365/185.22 |
| 2002/0012282 A1 | 1/2002 | Saito et al. ................. | 365/200 |
| 2002/0046318 A1 | 4/2002 | Harari et al. ............... | 711/103 |

FOREIGN PATENT DOCUMENTS

| | | |
|---|---|---|
| EP | 0 797 145 A1 | 9/1997 |
| EP | 1 126 372 A1 | 8/2001 |

* cited by examiner

*Primary Examiner*—Richard Elms
*Assistant Examiner*—Pho M. Luu
(74) *Attorney, Agent, or Firm*—Lisa K. Jorgenson; Robert Iannucci; Seed IP Law Group PLLC

(57) ABSTRACT

The memory device has a memory block, formed by a plurality of standard sectors and a redundancy portion; a control circuit, which controls programming and erasing of the data of the memory cells; and a correctness verifying circuit for the data stored in the memory cells. The correctness verifying circuit is enabled by the control circuit and generates an incorrect-datum signal in the event of detection of at least one non-functioning cell. The control circuit moreover activates redundancy, enabling the redundancy portion and storing redundancy data in a redundancy-memory stage in response to detecting an incorrect datum. Various solutions implement column, row and sector redundancy, both in case of erasing and programming.

41 Claims, 10 Drawing Sheets

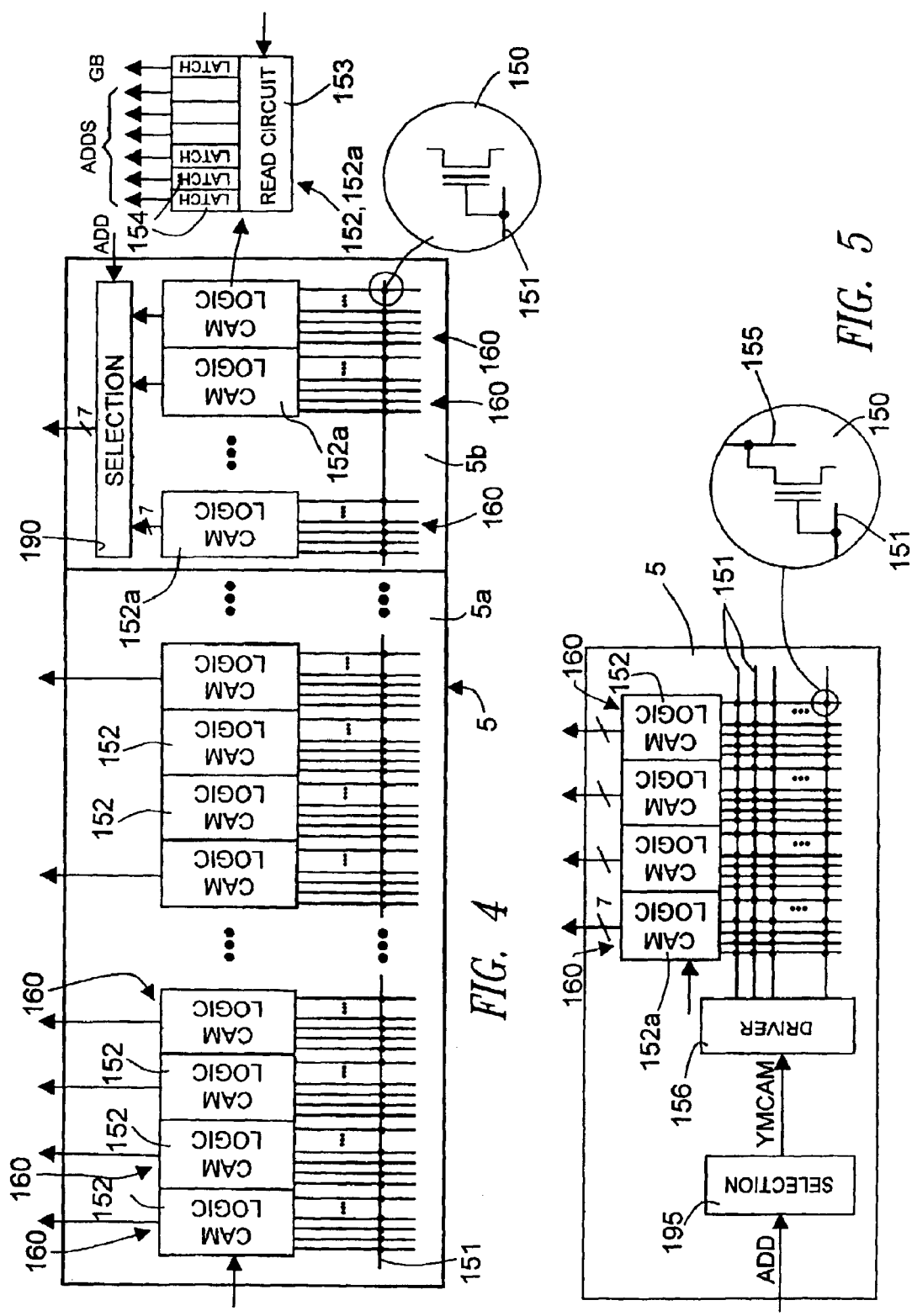

SELF-REPAIR METHOD FOR NONVOLATILE MEMORY DEVICES WITH ERASING/PROGRAMMING FAILURE, AND RELATIVE NONVOLATILE MEMORY DEVICE

BACKGROUND OF THE INVENTION

1. Field of the Invention

The present invention relates to a self-repair method for nonvolatile memory devices with erasing/programming failure, and a relative nonvolatile memory device.

2. Description of the Related Art

As is known, in a semiconductor multimegabit nonvolatile memory device (EPROM or flash), the cell array constitutes a substantial fraction, accounting for between 40% and 70% of the total area. The applications for which nonvolatile memories are designed require a perfect functionality of all the cells in the array during the operative steps of the device (reading, programming and erasing).

In theory, the presence of at least one cell that does not operate correctly is sufficient for the entire memory device to be unusable. This condition is of considerable importance during industrial fabrication of this type of integrated device, in so far as there exists a non-zero likelihood of failure of a memory cell in any given production lot.

In the absence of solutions for detecting and correcting failure bits, the likelihood of having devices with perfectly operating memory cells in a given production lot would be very low and hence unacceptable from the point of view of large-scale industrial production. This likelihood indicates the so-called "prime yield" of the lot and represents a figure of merit of the production process.

In order to increase the yield of memory devices in the final manufacture steps, circuit solutions have been employed for recognizing and correcting the failure bits. A technique commonly adopted for this purpose uses memory cells additional to the ones making up the memory array and designed to replace corresponding failed array cells. The cells used, defined as redundant or redundancy cells, are identical to the array cells. They must be appropriately managed by circuits additional to the ones already normally present inside the device.

In particular, the organization of the memory favors the use of entire rows or entire columns made up of redundant cells, such as to replace corresponding rows or columns of the array even in the presence of just one failed cell. In this way, a compromise is reached between the power for correcting the failures and the area required for the circuits managing the redundancy.

Usually, activation of redundancy occurs during the electrical-wafer sorting (EWS) step, during which, through an appropriate test flow, the cells that present some problem are identified and replaced with the redundancy cells. The redundancy, whether row redundancy or column redundancy, is thus able to correct only the defects that occur at time zero, i.e., in the factory.

For instance, should a sensible reduction in gain arise for a given cell, on account of cycling, the cell could no longer be able to get over the erasing and programming steps, so causing failure of the entire device.

BRIEF SUMMARY OF THE INVENTION

An embodiment of the present invention provides a method for solving the problem of failures which occur during operation of the memory.

An embodiment of the invention is self-repair method for a nonvolatile memory including a memory array having a plurality of sectors and a redundancy portion, the sectors being made up of a plurality of memory cells arranged in memory lines, each of which stores a datum. The method includes:

performing a modification operation of data of the memory cells, the modification operation being chosen between programming and erasing;

verifying the correctness of the data of the memory cells;

if the verification step has revealed a non-functioning cell, redunding said non-functioning cell by activating said redundancy portion and storing redundancy data in nonvolatile memory elements.

BRIEF DESCRIPTION OF THE SEVERAL VIEWS OF THE DRAWINGS

For an understanding of the present invention preferred embodiments thereof are now described, purely by way of non-limiting example, with reference to the attached drawings, wherein:

FIG. 4 shows a block diagram of a detail of FIG. 1;

FIG. 5 shows a different embodiment of the detail of FIG. 4;

DETAILED DESCRIPTION OF THE INVENTION

The invention is based upon the activation of in-field self-repair and/or self-replacement procedures by the memory itself when, during writing and/or erasing operations (i.e., during normal memory operation), one or more failed cells are detected. The above procedures thus enable subsequent continuation of use of the memory, without having to discard it.

According to an aspect of the invention, a procedure and an architecture are provided, which operate in the event of erasing failure and use free redundancy resources. The procedure envisages a check for detecting when erasing has not been completed on account of a failure and for detecting whether there exist sufficient resources for replacing the failed cells.

According to another aspect of the invention, a procedure and an architecture are proposed, which operate in the event of a failure in programming (writing). In this case, the problem is linked to the fact that the activation of the column redundancy on the entire sector means shifting bits of other rows that could already have been programmed. According to one solution, the entire address of a failed cell is stored in nonvolatile redundancy registers. Alternatively, a small sector is provided, wherein the entire row containing the failed cells is driven by the in-field replaced or redunded address. A further option envisages a column redundancy similar to the one performed during EWS at the expense of programming time in the cases where the execution times for programming do not represent a critical factor.

1. Erasing Failure

The problems linked to management of failures during erasing regards the writing of all "1's" in the memory array, and hence, knowing a priori the contents of all the cells. The present solution provides that the memory has free redundancy resources which can be used in the event of a failure being detected. In particular, at the end of or prior to erasing a verification ore check is made on the cells that have been erased or that are to be erased. If erasing is not successful on account of a number of failures (for example failed columns or failed rows) that is compatible with the remaining redundancy resources, redundancy is activated, i.e., the address of the failed portions are written in suitably provided memory units (CAMs or UPROMs) containing nonvolatile cells. The redundancy cells should be kept always ready during the entire life of the device and, hence, should be soft programmed at each erasing cycle so as to be functioning perfectly at the moment when they are needed.

For a better understanding of the solutions described hereinafter, a brief description of the structure of a memory device which can be used according to the invention will now be provided, with reference to FIG. 1.

Figure 1:
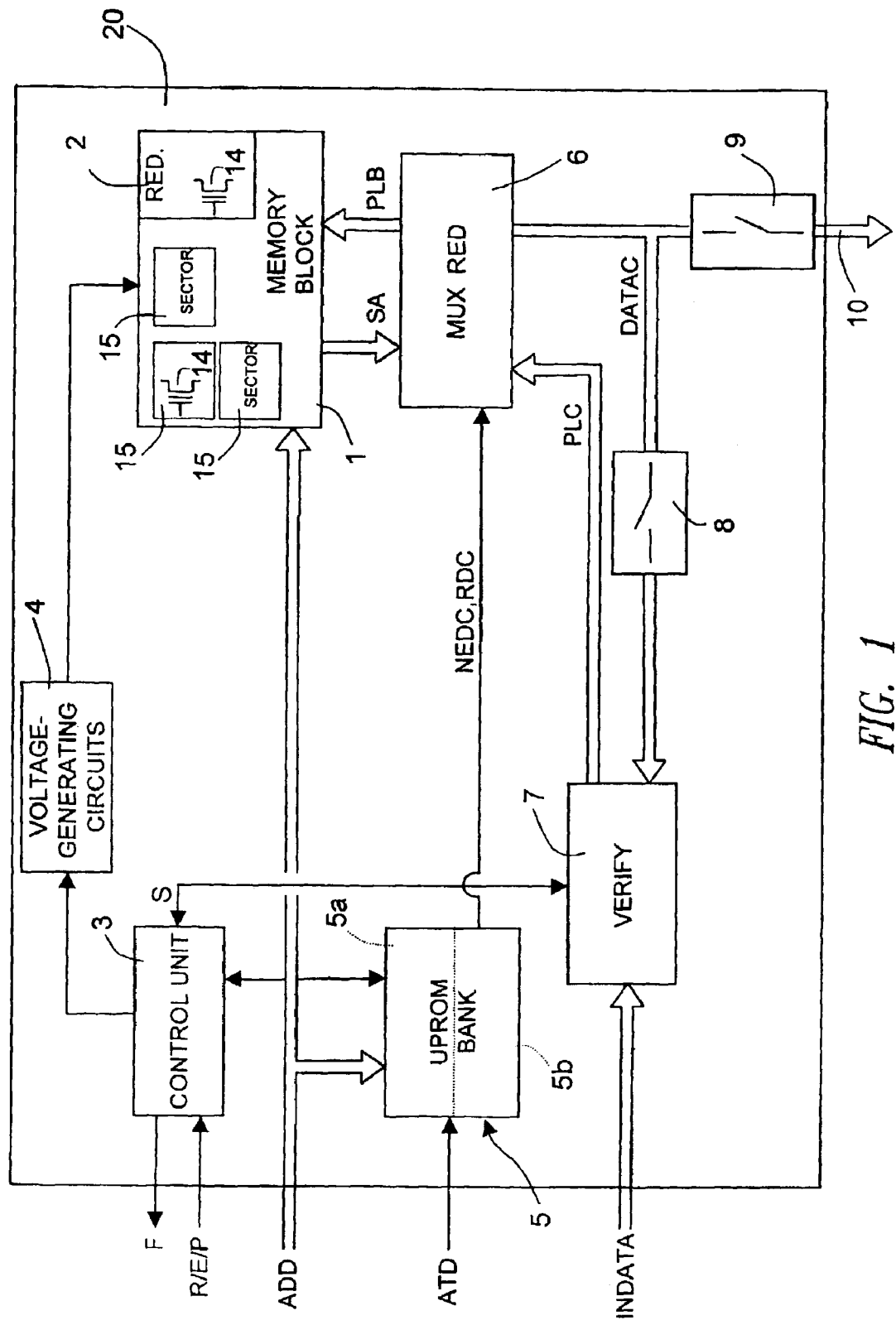
FIG. 1 is a block diagram of a memory implementing a self-correction procedure in case of programming or erasing error.

FIG. 1 shows a block diagram of a memory (as regards the portions involved in managing in-field redundancy), with redundancy activatable both in EWS and in-field, in case of an erasing or programming failure, as described hereinafter. The memory may implement a row redundancy, a column redundancy, or a sector redundancy.

In FIG. 1 a memory device 20 comprises a memory block 1 including, in a known way, a memory array, row-addressing and column-addressing circuits and read circuits (sense amplifiers). The memory array is made up, in a known way, of a plurality of standard sectors 15, which, in turn, include a plurality of nonvolatile cells 14 (only one of which is shown in FIG. 1). In addition, the memory array comprises a redundancy portion 2 illustrated schematically. The structure and physical arrangement of the redundancy portion 2 depends, of course, on whether row redundancy, column redundancy, or sector redundancy is used. Examples of arrangement and structure of the redundancy portion 2 are provided hereinafter, according to the different embodiments described.

A control unit 3 receives from outside signals R/E/P of the operation (reading, erasing, or programming) to be performed, issues a failed-memory signal F, and controls biasing voltage generating circuits 4, which supply the appropriate biasing to the memory block 2.

An UPROM bank 5 receives an address-modify signal and addresses ADD for the cells to be addressed. The UPROM bank 5 moreover sends signals NEDC and RDC, which respectively indicate redundancy activation and the address of the cell requiring redundancy, to a redundancy multiplexer 6. The addresses ADD are moreover supplied to the memory block 1.

The redundancy multiplexer 6 receives read bits SA from the memory block 1 and supplies programming control signals PLB to the memory block 1. In addition, it supplies redunded data DATAC to a verify block 7 and receives from the latter programming control signals PLC.

The redunded data DATAC outputted by the redundancy multiplexer 6 are supplied to the verify block 7 through a first switch 8 controlled by the control unit 3. The redunded data DATAC are moreover supplied to an output 10 of the memory device 20, through a second switch 9 controlled by the control unit 3. The output 10 may be formed by data pins or may be connected to other devices integrated in the same chip. Upstream of the output 10 there may moreover be provided an I/O logic (not illustrated), which enables input/output of the bits of just one (8/16/32-bit) word at a time.

The verify block 7 moreover exchanges control signals S with the control unit 3. In particular, it receives an activation signal and sends result-verification signals, as is, for example, explained in greater detail with reference to FIGS. 2, 3 and 9. In addition, the verify block 7 receives from outside input data INDATA to compare them with the redunded data DATAC.

In FIG. 1, the UPROM bank 15 comprises two distinct sets of UPROMs, namely a first set 5a, made up of the UPROMs initialized in the EWS step, so as to store data regarding standard redundancy, and a second set 5b made up of the UPROMs usable for in-field redundancy. Alternatively, it is possible to have a further two sets of UPROMs, but the redundancy activatable in-field may use both the second set 5b of the UPROM bank 5 and UPROMs of the first set 5a that have remained unused at the end of the EWS step. Otherwise, it is possible to have a single set of UPROMs and to use, for redundancy in-field, the UPROMs that were not used in the EWS step.

1.1 Column Redundancy

Figure 2:
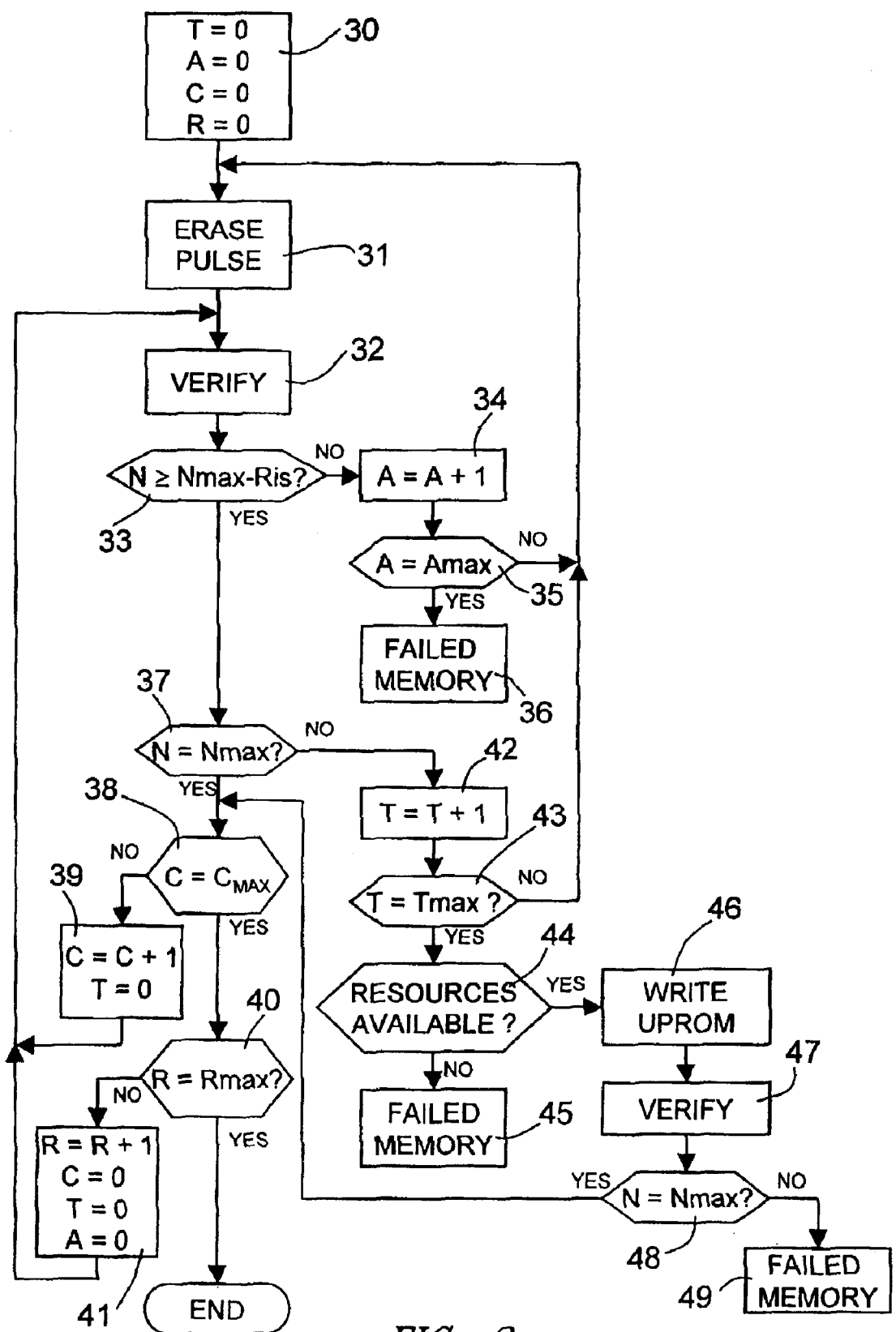
FIGS. 2 and 3 are flowcharts of an erasing operation performed using a column redundancy and a row redundancy, respectively.

This solution, the flowchart whereof is illustrated in FIG. 2, uses the architecture of the memory illustrated in FIG. 1. In this case, the redundancy portion 2 is made up of one or more columns within each sector, according to the architecture illustrated in FIG. 10 and described in greater detail hereinafter.

Initially, step 30, some counters, and namely an additional-pulse counter T, an erasing-pulse counter A, a column counter C, and a row counter R, are set to zero.

Next, step 31, an erasing pulse is sent to an entire sector, and then, step 32, a verify reading of one first word (addressed by the counters R and C) is performed, and the number N of bits the verification of which yields a positive result is counted. If the result of the verifying is positive for a number of cells below a threshold value, corresponding to the number of cells Nmax read simultaneously (e.g., 64 cells) minus the number of provided redundancy cells Ris (output NO from block 33), the erasing-pulse counter A is incremented, step 34, and a verification is made to see whether the maximum number of erasing pulses $A_{MAX}$ has been reached, step 35. If the maximum number has been reached (output YES from block 35), a failed-memory signal F is generated, step 36, and the procedure terminates. If, instead, the result is negative (output NO from block 35), a new erasing pulse is supplied, step 31.

If verifying has yielded a positive result for at least Nmax-Ris cells (output YES from block 33), a check is made to see whether all the cells read in parallel have been erased (e.g., whether N=Nmax=64), step 37. If the result is YES, step 38, a check is made to see whether all the columns have been verified. If the result is negative, step 39, the column counter C is incremented, the additional-pulse counter T is reset to zero, and a new verify reading is performed, returning to step 32.

If all the columns have been verified (output YES from step 38), a check is made to see whether all the rows have been verified, step 40. If the result is negative, step 41, the row counter R is incremented, and the column counter C and the additional-pulse counter T are reset to zero, and the verify reading is carried out, returning to step 32. If the result is positive, the procedure terminates.

If, at the end of verify reading, the number of cells not erased is other than zero, but less than or equal to Ris (output NO from step 37), the additional-pulse counter T is incremented, step 42, and a check is made to see whether this is equal to the maximum number Tmax, step 43. If the result is negative (output NO from step 43), a new erasing pulse is supplied, so returning to step 31. If the result is positive (output YES from step 43), a check is made to see whether there exist sufficient available redundancy resources, step 44. If not (output NO from step 44), a failed-memory signal F is generated, step 45, and the procedure terminates. Otherwise, if there are sufficient resources available (output YES from step 44), the UPROM bank 5 (see FIG. 1) is written with the address of the column that contains the failed cell (step 46). Then a new verify reading is performed with the redundancy activated, i.e., by replacing the column or columns containing the failed cell or cells with the redundancy column or columns, block 47. If the result is positive for all the cells read (output YES from step 48), the procedure returns to step 38, in order to proceed with verify reading on other words. If the result is negative (output NO from step 48), a failed-memory signal is generated, step 49, and the procedure terminates.

It is to be pointed out that when column redundancy is performed, it is not necessary to replace one column at a time. According to the technological requirements and the area available, the minimum number of columns that can be replaced (hereinafter referred to as column packet) is established in the design phase. In practice, if the column packet contains n columns, whenever redundancy is activated, n columns are replaced (one of which contains the failed bit) with n redundancy columns.

It is clear that the larger the column packet, the fewer memory elements are required for storing the address of the replaced or redunded columns. In fact, in the case of a column packet formed by four columns, the address of the replaced columns contains two address bits less than the complete address.

In the flowchart described, then, Ris indicates the number of column packets available, which do not necessarily correspond to the number of replaced array columns. If two column packets of four columns each are available, the number of replaced columns is eight.

1.2 Row Redundancy

Figure 3:
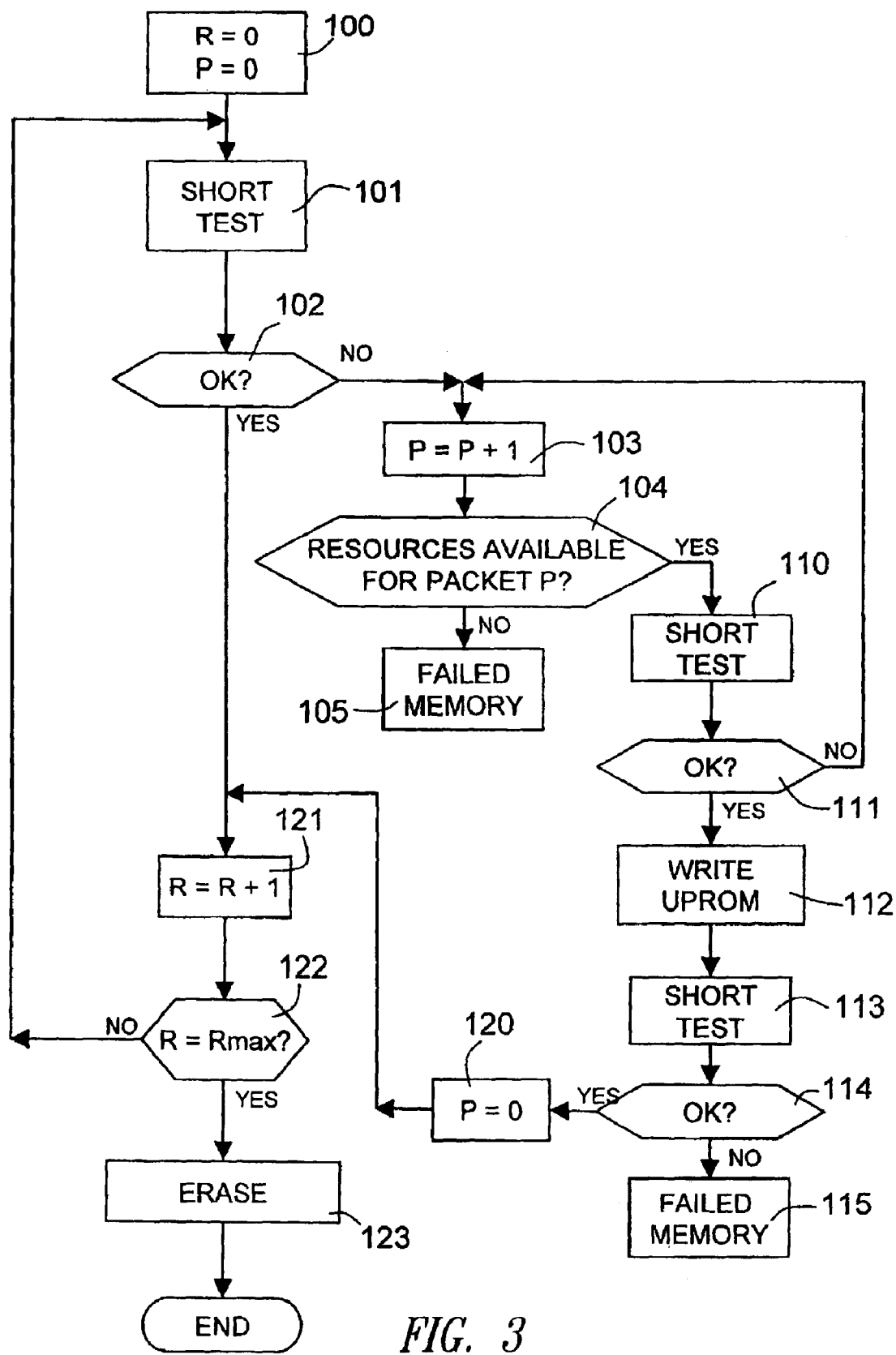

This solution, the flowchart whereof is illustrated in FIG. 3, uses an architecture similar to that of FIG. 1, with the difference that the redundancy multiplexer 6 is not present (at least as far as redundancy in-field is concerned), and the outputs of the portion 5a of the UPROM bank 5 are supplied directly to the memory block 1, so that, when a row containing one or more non-functioning cells is to be read, the failed row or set of rows is ignored, and the redundancy row is automatically addressed. The redundancy rows are preferably arranged within the standard sector, so as to simplify their addressing. Alternatively, they may be arranged in a separate auxiliary sector, as is described hereinafter, with reference to FIG. 12.

FIG. 3 refers, in particular, to the case where a short circuit is present between rows of the memory array. In general, the search method depends upon the type of failure which is to be remedied during the life of the memory and which is established in the design phase according to the problems of the technology.

To identify any short circuits, a suitably designed short-circuit test is used, for example, the test described in EP-A-1 083 575, which is incorporated by reference in its entirety.

With this type of test, given that the decoder is of the CMOS binary type, once the charging transients of the rows have settled, no current should flow through the supply line of the row decoder. If, instead, a current is detected, this means that there is a short circuit. However, the number of rows that are shorted is not known.

In order to identify how many rows are involved, according to the embodiment illustrated, initially the rows are scanned. When a short is identified, all the rows that belong to a minimum packet of redunded rows are selected simultaneously, and the test is repeated. If the outcome of the test is still negative, the next packet of rows is also selected until the set of shorted lines is identified or until the redundancy resources available are used up.

In detail, initially, before carrying out erasing, the memory searches for any rows to be replaced. To this end (see FIG. 3), step 100, a row counter R and a row-packet counter P (where a packet of rows comprises the minimum number of redundable rows, as mentioned above) are set to zero.

Next, step 101, the test for determining whether the row checked is shorted is carried out, for example, by performing the test described in EP-A-1 083 575. If the test does not reveal any short (output YES from the verify block, 102), the row counter is incremented, step 121. If, instead, a short is detected (output NO from block 102), an entire packet of rows is selected, including the row that has just been checked, and the row-packet counter P is incremented, step 103. Then, a check is made to see whether there are redundancy resources free for the packet that has just been selected, step 104. If there are not (output NO from block 104), a failed-memory signal is generated, step 105, and the procedure terminates. If, instead there are (output YES from block 104), the test is repeated on the entire packet, simultaneously selecting all the rows of the packet, step 110. If the packet of rows selected or some of the rows of the packet are shorted with other rows of the memory array (output NO from the verify block, 111), a further packet of rows is selected, which is to be tested simultaneously with the packet (or packets) previously selected, returning to the step of incrementing the row-packet counter, step 103.

If the rows belonging to the packet or to the packets selected are not shorted with other rows of the array (output YES from step 111), the redundancy on the packet or packets selected is activated, step 112. For this purpose, a guard bit, which signals activation of redundancy, the address of the packet of failed rows, and the address of the redundancy row packet are written in one or more UPROMs of the UPROM bank 5 (see FIG. 1).

Next, step 113, to ensure that the redundancy rows are functioning, the short test is carried out on the redundancy packet or packets. If the result of the test is negative (output NO from step 114), a failed-memory signal is generated (step 115), and the procedure terminates. If, instead, the result is positive (output YES from step 114), the packet count is reset, step 120, and the test is then carried out on the subsequent rows.

To this end, the row counter R is incremented, step 121 (which follows also the positive verification at step 102), and a check is made to see whether all the rows have already been examined, step 122. If they have not, the short test is performed on the row that has just been selected, returning to step 101. If they have, erasing of the sector is carried out, including the redundancy cells that have just been activated, step 123.

1.3 Sector Redundancy

This solution is based upon the presence of special sectors, called "redundancy sectors," capable of replacing completely standard sectors of the memory array when the test carried out before or after an erasing operation reveals the presence of failed cells. In this case, the standard sector in which the failure has been detected is replaced completely by a special redundancy sector. The information regarding activation of redundancy of a sector is stored in an UPROM belonging to the UPROM bank similar to the one illustrated in FIG. 1, as is described in greater detail hereinafter with reference to FIGS. 4–8. On the other hand, the architecture of FIG. 1 is, generally speaking, valid also for this solution, except for the fact that the redundancy multiplexer 6 is not present (at least as far as in-field redundancy is concerned), and the outputs of the UPROM bank 5 regarding in-field redundancy are no longer supplied to the redundancy multiplexer 6, but to special addressing units of the memory block 1, as described in detail hereinafter. Consequently, the UPROM bank will hereinafter be identified again by the reference number 5.

In particular, the UPROM bank 5 can be organized according to a parallel structure or a matrix structure.

The first solution (parallel organization) is illustrated in FIG. 4. The UPROM bank 5 comprises a plurality of nonvolatile memory elements 150, for instance flash cells, which are represented schematically. In particular, each memory element 150 may comprise a single flash cell, as shown in the enlarged detail, and a plurality of parallel-connected flash cells to increase the total current flowing through them.

The nonvolatile memory elements 150 are aligned and are connected to a single control line 151, on which, when the memory device is turned on, an activation signal is supplied. The nonvolatile memory elements 150 are connected, in groups, to logic blocks 152, 152a having a similar structure and illustrated in enlarged detail in FIG. 4. Specifically, each logic block 152, 152a (indicated by CAM LOGIC) comprises a read circuit 153 and a plurality of temporary memory elements, for instance, latches 154, one for each memory element 150, each set of nonvolatile memory elements 150 thus forming, together with the respective logic block 152, 152a, a memory unit or UPROM 160.

When the memory device is turned on, the logic blocks 152, 152a receive control signals, which determine biasing and reading of the nonvolatile memory elements 150 and storing of the contents of each of these in a respective latch 154. Consequently, during normal operation of the memory, the information stored in the nonvolatile memory elements 150 is available on the outputs of the logic blocks 152, 152a and can be used when required.

Analogously to FIG. 1, in this solution the UPROM bank 5 comprises a first portion 5a, which stores data necessary for the memory operation (in a per se known manner) and for EWS redundancy, the logic blocks whereof are designated by 152; and a second portion 5b, corresponding to the redundancy activatable in-field, the logic blocks whereof are designated by 152a.

With particular regard to the second portion 5b, in the embodiment shown, the nonvolatile memory elements 150 of each set (connected to a logic block 152a) are designed to store the data regarding a respective sector to be redunded in a sector column.

Figure 6:
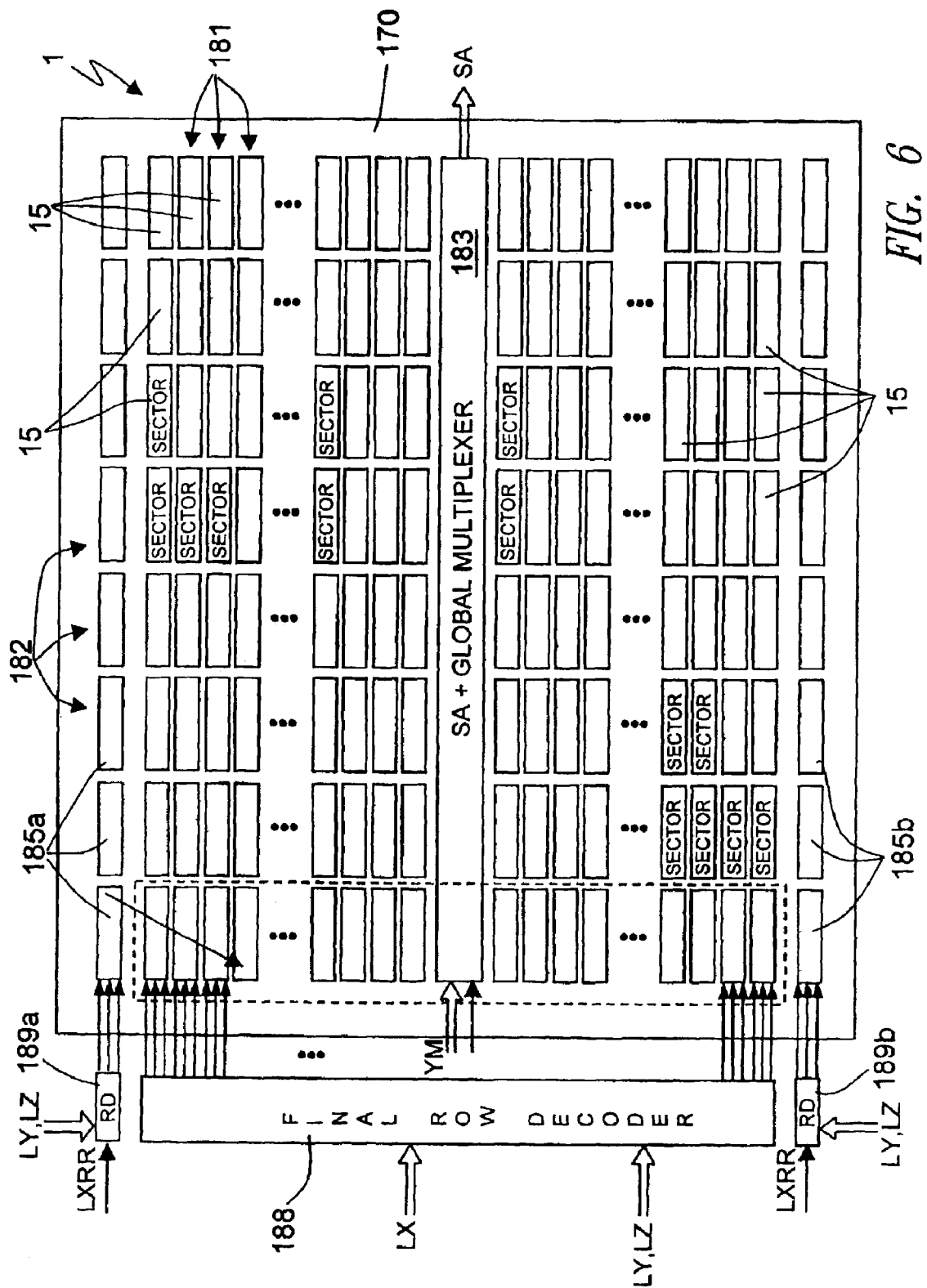
FIG. 6 is another block diagram of another detail of FIG. 1.

In this connection, reference is to be made to FIG. 6, which illustrates an architecture of a memory array 170, in which M sectors 15 (for example, 512 sectors) are arranged on J sector rows 181 (for example, 64 rows) and K sector columns 182 (for example, 8 columns). A global column decoder 183 (comprising the read circuits) is arranged on a central row of the array, among the 32 rows of top sectors and the 32 rows of bottom sectors. The global common decoder 183 receives column-addressing signals YM<15:0>. In addition, it receives the necessary biasings from the biasing voltage generating circuits 4 (see FIG. 1) and outputs the data read SA. In a way not shown, the global column decoder 183 further receives programming-control signals and comprises switches for connecting the cells that are to be programmed, in a per se known manner.

A redundancy sector 185, 185b is arranged at the top and at the bottom of each sector column. In all, eight top redundancy sectors 185a and eight bottom redundancy sectors 185b are present, which in practice form the redundancy portion 2 of FIG. 1.

A final row decoder 188 receives sector-row-addressing signals RX (each of which identifies a respective sector row 181) and row-address signals LY, LZ (each of which identifies a respective row within the sectors 15), and generates the row biasings for the wordlines of the memory array 170. A top row driver 189a is associated to the top redundancy sectors 185a, and a bottom row driver 189b is associated to the bottom redundancy sectors 185b; the row drivers 189a, 189b receive redundancy-sector-addressing signals LXRR, as well as the row-address signals LY, LZ. Both the row decoder 188 and the row drivers 189a, 189b receive the necessary biasing from the biasing voltage generating circuits 4 of FIG. 1, in a not shown manner.

For each sector column 182, just one redundancy sector 185a, 185b is usable, according to whether the sector to be replaced is arranged at the top or at the bottom of the global column decoder 183.

With the above type of organization of the memory array 170, the second portion 5b of the UPROM bank 5 (see FIG. 4) comprises fifty-six nonvolatile memory elements 150, i.e., eight sets of seven non volatile memory elements 150, wherein each set of nonvolatile memory elements 150 is associated to a sector column 182. Of the seven nonvolatile memory elements 150 of each set, six are to store the six address bits ADDS of the sector to be replaced within the respective sector column 182, and the seventh memory element 150 stores a guard bit GB, which signals whether the sector redundancy has already been activated within the respective sector column 182.

As mentioned above, each set of nonvolatile memory elements 150 is connected to a respective logic block 125a, which, in addition to the read circuit 153, comprises seven latches 154.

Figure 7:
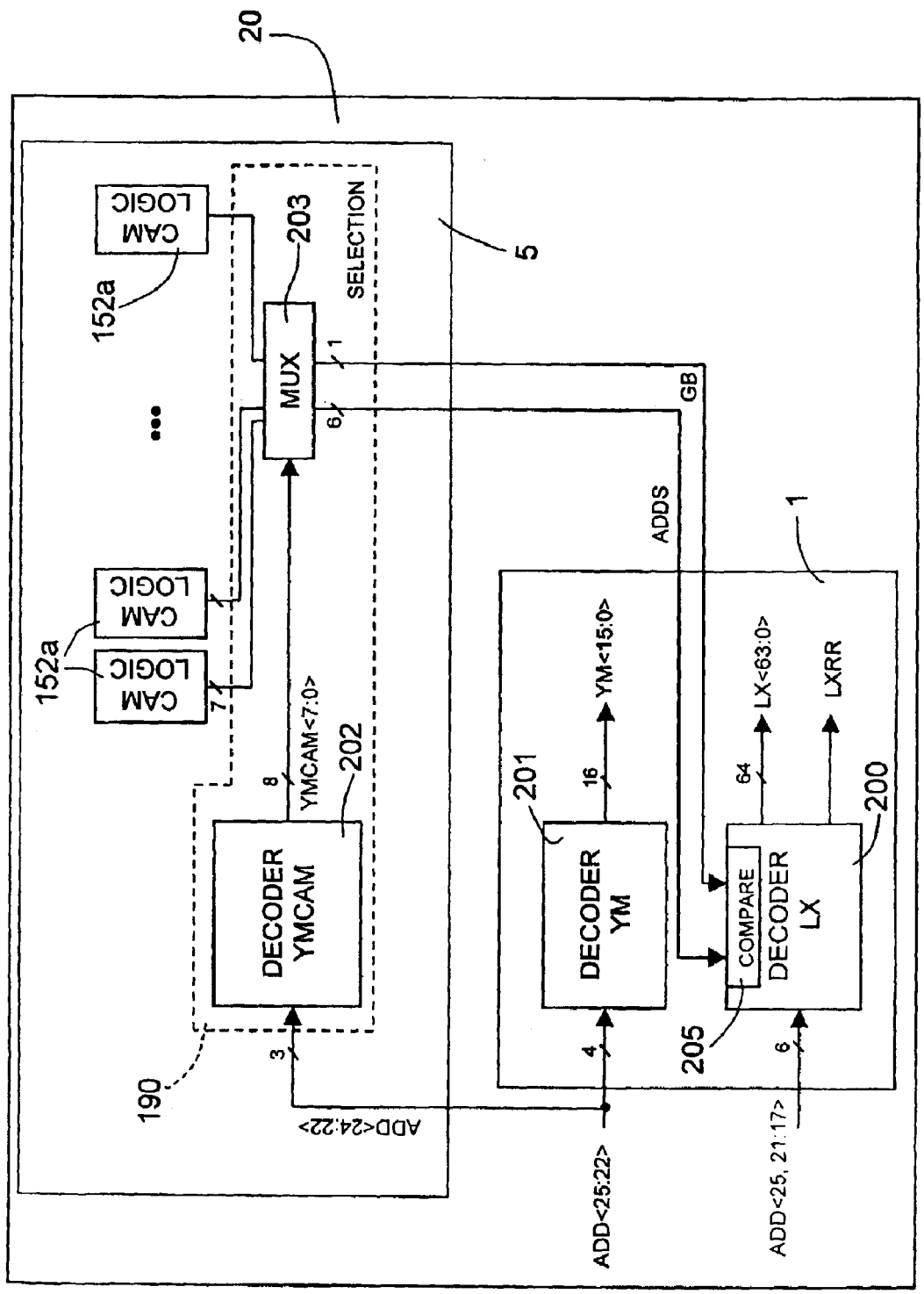
FIG. 7 shows a block diagram of a detail of FIG. 1, which can be used with the architecture of FIG. 4.

The outputs of each latch 154 are supplied to a selection circuit 190, which moreover receives the address of the sector column 182 that is selected, as shown in greater detail in FIG. 7.

FIG. 7 shows part of the memory-block decoding circuits 1, including a row predecoder 200 and a first column predecoder 201. In turn, the selection circuit 190 comprises a second column predecoder 202 and a multiplexer 203.

The row predecoder 200 receives at the input six bits corresponding to the addresses ADD<25, 21:17> and outputs sixty-four sector-row-addressing signals LX, which are supplied to the final row decoder 188 of FIG. 6 and a redundancy-sector-addressing signal LXRR supplied to the row drivers 189a, 189b. To this end, the row predecoder 200, in addition to the normal predecoding circuits, comprises a comparator circuit 205, which receives the six bits ADDS<25, 21:17> for addressing the sector row 181 to which the sector to be replaced belongs, and the guard bit GB, the six bits being supplied by the selection circuit 190. In practice, the comparator circuit 205 is a combinatorial circuit, which compares the six bits ADDS with the address ADD<25, 21:17>, in order to evaluate whether the sector row 181 at that moment addressed coincides with the one stored in the UPROM 160 just read. If the result of the comparison is positive and the value of the guard bit GB indicates that in-field redundancy has been activated, for example, it has a logic level "1", the comparator circuit 205 inhibits transmission outwards of the sector-row-addressing signals (which, as has been said, identify the sector rows 181), and activates the redundancy-sector-addressing signal LXRR, determining, in practice, replacement of the sector 15 originally addressed with the corresponding redundancy sector 185a or 185b (see FIG. 6). The selection between the top redundancy sector 185a and the bottom redundancy sector 185b is made through the global column decoder 183, which biases the top or bottom sectors 15 and the corresponding redundancy sectors 185a or 185b according to the column-addressing signals YM.

The first column predecoder 201 receives four address bits ADD<25:22> and outputs sixteen column-addressing signals YM<15:0>, in a per se known manner.

The selection circuit 190 receives three of the four address bits ADD<25:22>, namely, the bits ADD<24:22>, and outputs eight sector-column-addressing signals YMCAM<7:0>, which are supplied to the multiplexer 203. The latter is connected to the outputs of the logic blocks 152a and, on the basis of the sector-column-addressing signal YMCAM received, selects which bits are to be supplied to the row pre-decoder 200. In practice, the multiplexer 203 connects the output of the logic block 152a associated to the sector column 182 at that moment selected with the row predecoder 200, namely, the comparator circuit 205 in order to enable the latter to verify whether redundancy has already been activated and possibly to disable the generation of the sector-row-addressing signals LX and to activate generation of the redundancy-sector-addressing signal LXRR, as explained above.

FIG. 5 illustrates an architecture of the UPROM bank 5, alternative to the architecture of a parallel type illustrated in FIG. 4. Also here, the UPROM bank 5 comprises a plurality of nonvolatile memory elements 150, for instance flash cells, represented schematically, as described previously with reference to FIG. 4. The nonvolatile memory elements 150 are arranged in rows and columns, and are connected to control lines 151 and to bitlines 155. In detail, the nonvolatile memory elements 150, arranged on a same row, are connected, with their control terminals, to a same control line 151, and the nonvolatile memory elements 150, arranged on a same column, are connected, with one of their output terminals, to a same bitline 155. The control lines 151 are driven by a driver 156, controlled (during reading/writing/erasing) by eight row-addressing signals CAM, again designated by YMCAM<7:0> since, as regards the nonvolatile memory elements 150 that store the in-field redundancy information, they are similar to the sector-column-addressing signals YMCAM<7:0> of FIG. 7 and, indeed, identify a sector column 182 of FIG. 6. The row-addressing signals CAM YMCAM<7:0> are generated by a selection circuit 195 on the basis of the address bits ADD<24:22>, as explained in greater detail with reference to FIG. 8.

The bitlines 151 are connected to logic blocks 152, 152a similar to those of FIG. 4, which, as regards the nonvolatile memory elements 150 that store the in-field redundancy information, outputs six address bits ADDS and a guard bit GB. For example, the nonvolatile memory elements 150 designed for storing the in-field redundancy information, are all connected to a same logic block 152a and are directly selected by the row-addressing signals CAM YMCAM<7:0>. In practice, also in this case, each set of memory cells 150 associated to a same logic block 152, 152a and arranged on one row, together with the respective logic block 152, 152a, forms an UPROM 160.

Figure 8:
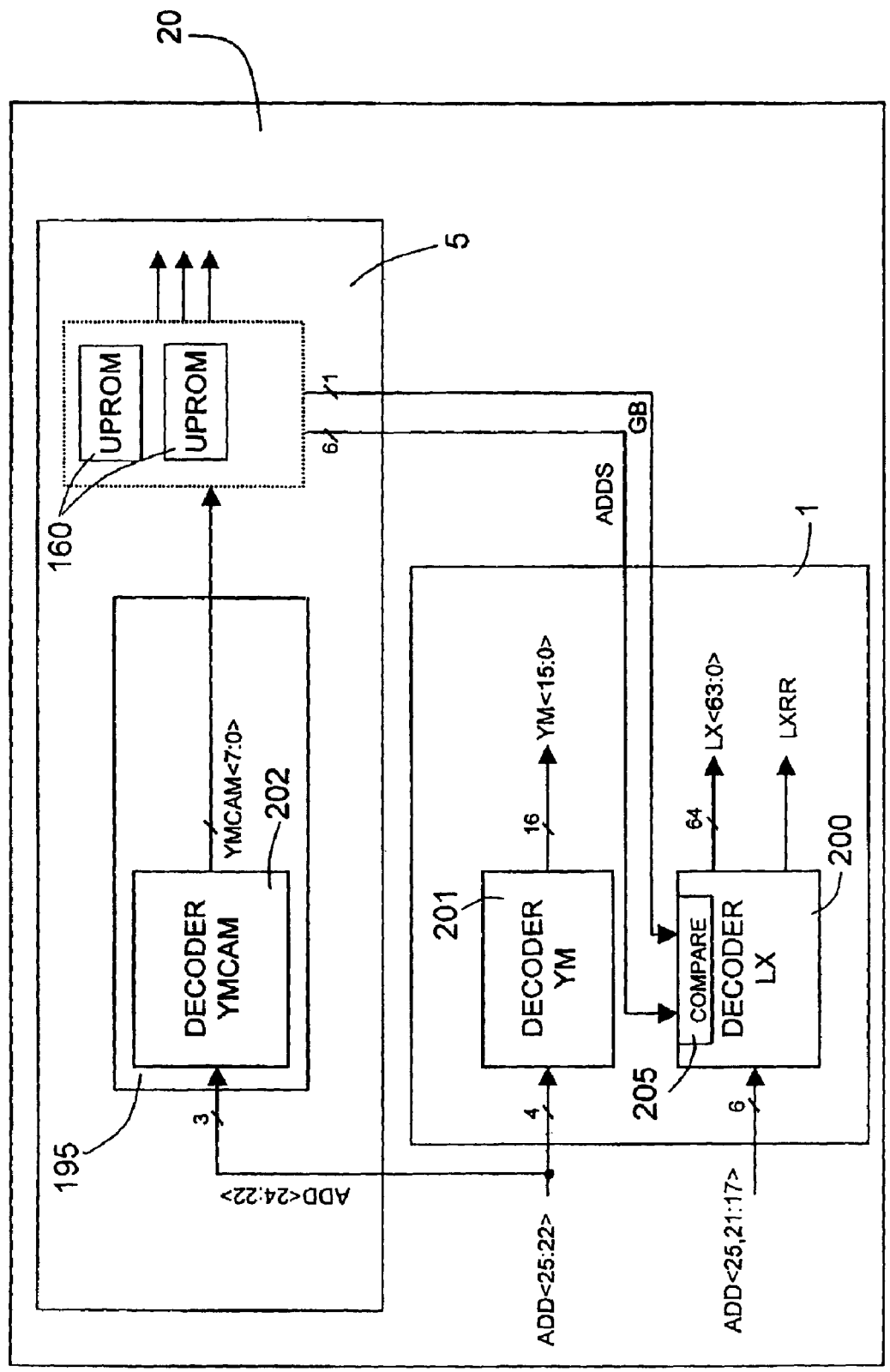
FIG. 8 shows a block diagram of a detail of FIG. 1, which can be used with the architecture of FIG. 5.

As illustrated in FIG. 8, the selection circuit 195 is simplified with respect to the selection circuit 190 of FIG. 7. In particular, the multiplexer 203 is no longer present, and the second column predecoder 202 supplies the row-addressing signals CAM YMCAM<7:0> to the UPROMs 160 (via the driver 156). In addition, the outputs of the logic block 152a supplying the addresses ADDS and the guard bit GB are directly connected to the comparator circuit 205. FIG. 8 also shows the row predecoder 200 and the first column predecoder 201 of the memory block 1, these being similar to the corresponding components of FIG. 7.

Upon arrival of the addresses ADD<25:17>, the row predecoder 200 and the column predecoders 201, 202 decode the respective bits. In particular, the second column predecoder 202 drives the UPROMs 160 so as to enable reading of the contents of the nonvolatile memory elements 150 addressed, and supplies to the comparator 205 the addresses ADDS and the guard bit GB. The row predecoder 200 then outputs the redundancy-sector-addressing signal LXRR or the sector-row-addressing signals LX, according to whether or not in-field redundancy has already been activated, as described above with reference to FIG. 7.

Thereby, when an erasing operation is to be carried out and a failure in a cell of a standard sector 15 (failed sector) is detected, redundancy activation causes the UPROM 160 associated to the sector column 182 to which the failed sector belongs to be written with the address of the sector row 181 to which the failed sector belongs and with the guard bit GB, and the subsequent programming and reading operations are carried out directly on the redundancy sector 185a, 185b, which is activated by the generation of sector-row-addressing signals LX, as explained above with reference to FIGS. 7 and 8.

With the parallel architecture of the UPROM bank 5 illustrated in FIG. 4, access time is minimized (for example, it is equal to 4 ns with a supply voltage Vcc=3 V and 6 ns with Vcc=2.5 V), in so far as the delay introduced with respect to the traditional architecture of the memory is only due to the selection of the outputs of the logic blocks 152a by the multiplexer 203, to the operation of verifying the value of the guard bit GB, and to the possible replacement of the sector-row-addressing signals LX With the redundancy-sector-addressing signal LXRR.

The system does not pose any limitations on the operations of erasing/writing, given that the redundancy sectors operate exactly as the memory sectors. Furthermore, the number of individual faults that can be corrected is quite high and corresponds to 1.5 out of 1024 cells.

With the matrix architecture illustrated in FIG. 5, there is, instead, a smaller occupation of area, given that a smaller number of logic blocks are required. However, longer access times are obtained, owing to the need for carrying out a true reading of the nonvolatile memory elements 150.

2. Programming Failure

The problems linked to managing programming failures are due to the fact that activating redundancy (column redundancy, row redundancy, or even redundancy of an entire sector) means shifting bits of other rows and/or columns, which could have already been programmed. In fact, during programming, unlike erasing, the contents of the cells that have already been programmed must not be lost, and it is desirable not to worsen (or at least not to worsen substantially) the performance of the memory.

Hereinafter, three solutions are provided, identified as single-bit column redundancy, redundancy via auxiliary sector, and replacement of entire column and/or row. In addition, a sector redundancy may be implemented, in a altogether similar way to the one described with reference to erasing failure (see FIGS. 4 to 8), which hence will not be repeated.

2.1 Single-Bit Redundancy

In the case of single-bit column redundancy, each sector possesses a certain number of redundancy columns. Upon detection of a failed cell at the end of programming, the address of the failed cell is completely stored in one of the UPROMs belonging to the UPROM bank 5, and the failed cell is replaced, instead of the entire column.

Figure 9:
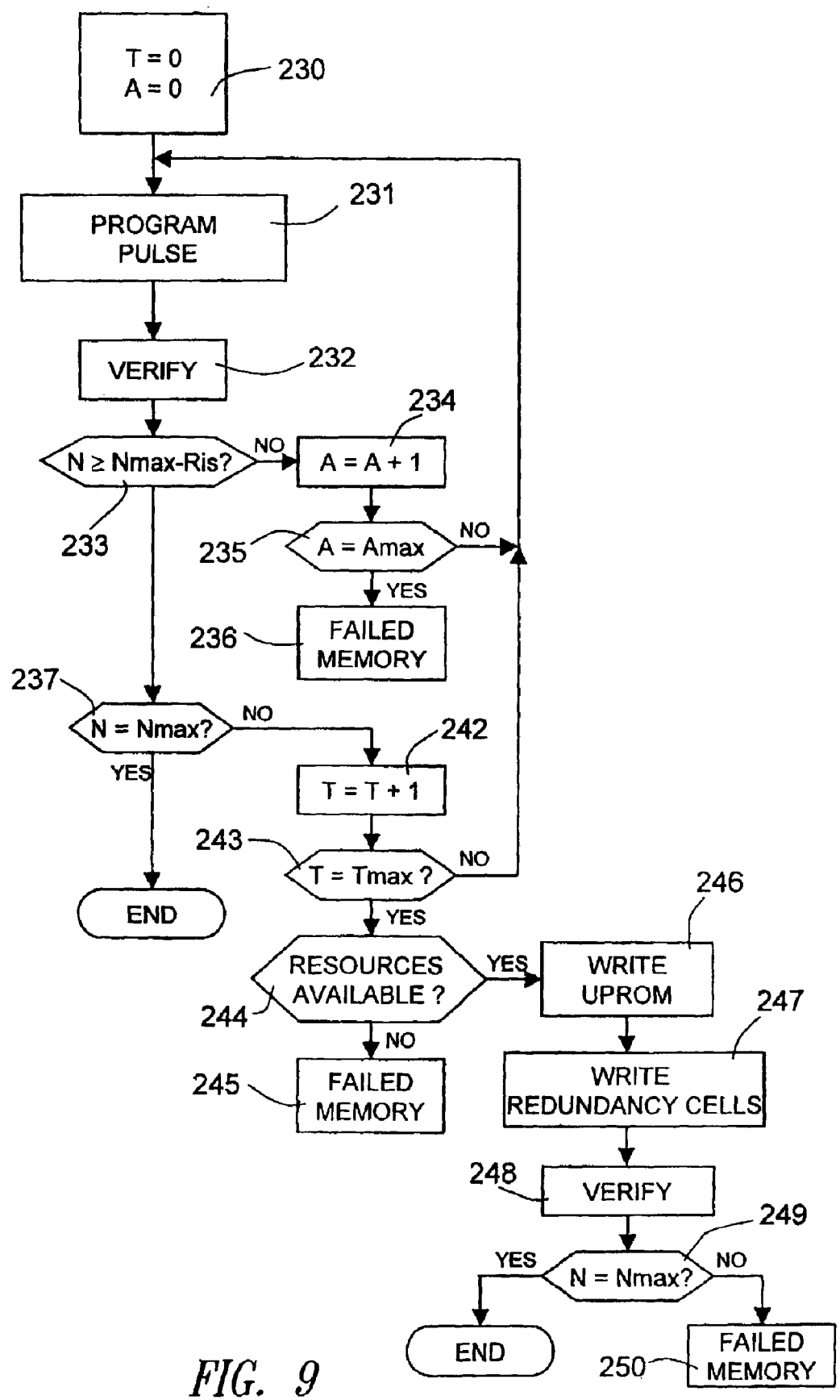
FIG. 9 shows a flowchart for a programming operation, performed using a column redundancy with single failure.

FIG. 9 shows a flowchart of a programming operation, in case of single-bit column redundancy.

Initially, step 230, an additional-pulse counter T and a programming-pulse counter A are set to zero.

Next, step 231, a programming pulse for a word is sent, and, step 232, a verify reading of the programmed word is performed. The number of memory cells the verification of which yields a positive result, is indicated by N. If the result of the verification is positive for a number of cells lower than a threshold value, corresponding to the number of cells Nmax read simultaneously (e.g., 64 cells) minus the number of existing redundancy cells Ris (output NO from block 233), the programming-pulse counter A is incremented, step 234, and a check is made to see whether the maximum number of erasing pulses Amax has been reached, step 235. If the maximum number has been reached (output YES from block 235), a failed-memory signal F is generated, step 236, and the procedure terminates. If, instead, the result is negative (output NO from block 235), a new erasing pulse is supplied, step 231.

If the verification has yielded a positive result for at least Nmax-Ris cells (output YES from block 233), a check is made to see whether all the cells read in parallel have been correctly programmed (e.g., whether N=64), step 237. If the result is YES, the programming procedure terminates. If the result is negative (output NO from block 237), the additional-pulse counter T is incremented, step 242, and a check is performed to see whether this is equal to the maximum number Tmax, step 243. If not (output NO from step 243), a new programming pulse is supplied, so returning to step 231. If the result is positive (output YES from step 243), a check is made to see whether there exist sufficient available redundancy resources, step 244. If not (output NO from step 244), a failed-memory signal F is generated, step 245, and the procedure terminates. Otherwise, if there are sufficient resources available (output YES from step 244), the UPROMs are written with the address of the column or columns that contain the failed cell, step 246 and the redundancy cells are written, step 247. Then, a new verify reading is performed with activated redundancy, i.e., wherein the newly written redundancy cells are read instead of the failed cells, block 248. If the result is positive for all the cells read (output YES from step 249), the procedure terminates. If the result is negative (output NO from step 249), a failed-memory signal F is generated, step 250, and the procedure terminates.

The general architecture of the memory capable of implementing the flow described above with reference to FIG. 9 is the one illustrated in FIG. 1. Typically, the existing redundancy resources are represented by cells arranged on the redundancy columns and on the same row as the failed cell, so that, during reading of a word, also the redundancy cells are addressed, and the replacement may be made.

In this case, a sense amplifier is dedicated to redundancy and operates in parallel to the sense amplifiers which supply the basic bits of the word read; consequently, it is possible to replace just one failed bit for each word. In practice, the memory block 1 supplies 65 bits to the multiplexer MUXRED 6, which selects only 64 of them, as illustrated in FIG. 10.

Figure 10:
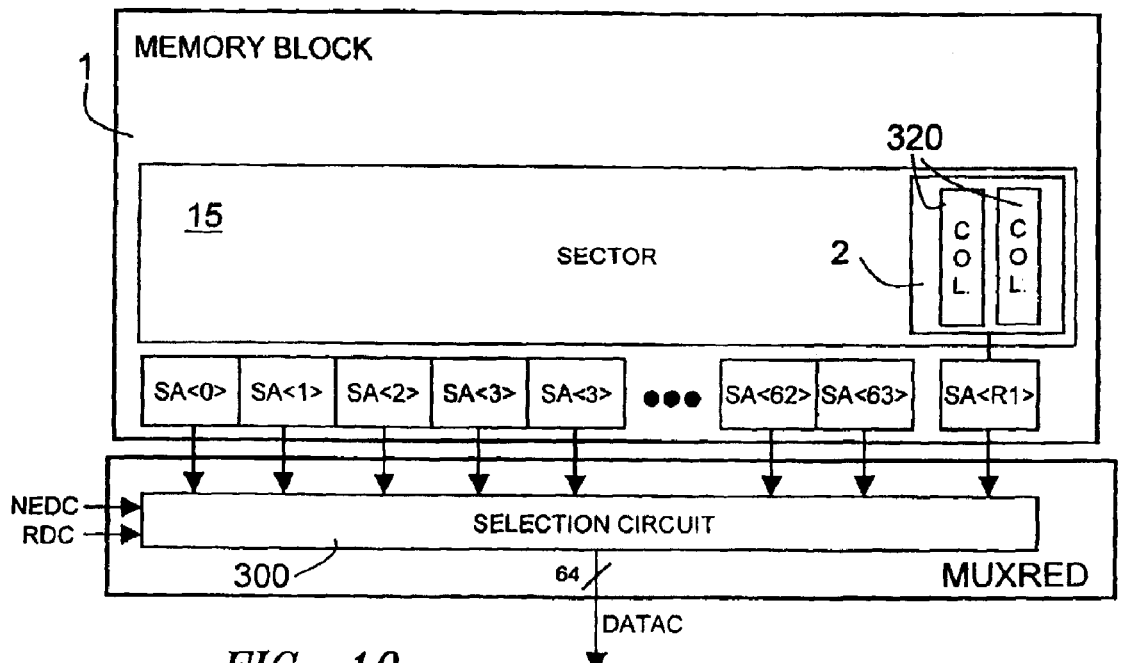
FIG. 10 shows a block diagram of a detail of FIG. 1.

As regards the memory block 1, FIG. 10 shows only the read circuits or sense amplifiers and the redundancy portion 2 here constituted by one or more columns 320 of the memory array. FIG. 10 shows, in particular, the arrangement of two columns 320 in a standard sector 15 (the redundancy portion 2 is thus distributed in this case within the different sectors). Sixty-four sense amplifiers SA<63:0> are present, one for each bit of the read word plus a sense amplifier SA<R1>, which receives the read redundancy bit. The outputs of the sense amplifiers SA are connected to the multiplexer MUXRED 6 formed by a selection circuit 300, which moreover receives, from the UPROM bank 5 of FIG. 1, a redundancy-activation signal NEDC and the address RDC of the cell to be replaced. For this purpose, as obvious to a person skilled in the art, the logic block 152a or the selection circuit 7 comprises a comparison circuitry, which receives the complete address ADD of the word to be read and compares it with the addresses present in the latches 154. If the addresses compared coincide and the guard bit GB is in the active state (i.e., redundancy is activated), the redundancy-activation signal NEDC is set in the active state (for example, "0"), and the address RDC of the cell to be replaced is sent to the multiplexer MUXRED 6.

The UPROM bank 5 can present a parallel or matrix organization, as described above with reference to FIGS. 4 and 5.

Thereby, when the redundancy activation signal NEDC is high, the selection circuit 300 replaces one of the 64 SA bits received (as specified by the address RDC) with the redundancy bit and outputs 64 bit of the redunded datum DATAC. Since reading of the redundancy cell is carried out in parallel and the signal NEDC is present before the bits read SA are supplied, an access delay is not present.

Figure 11:
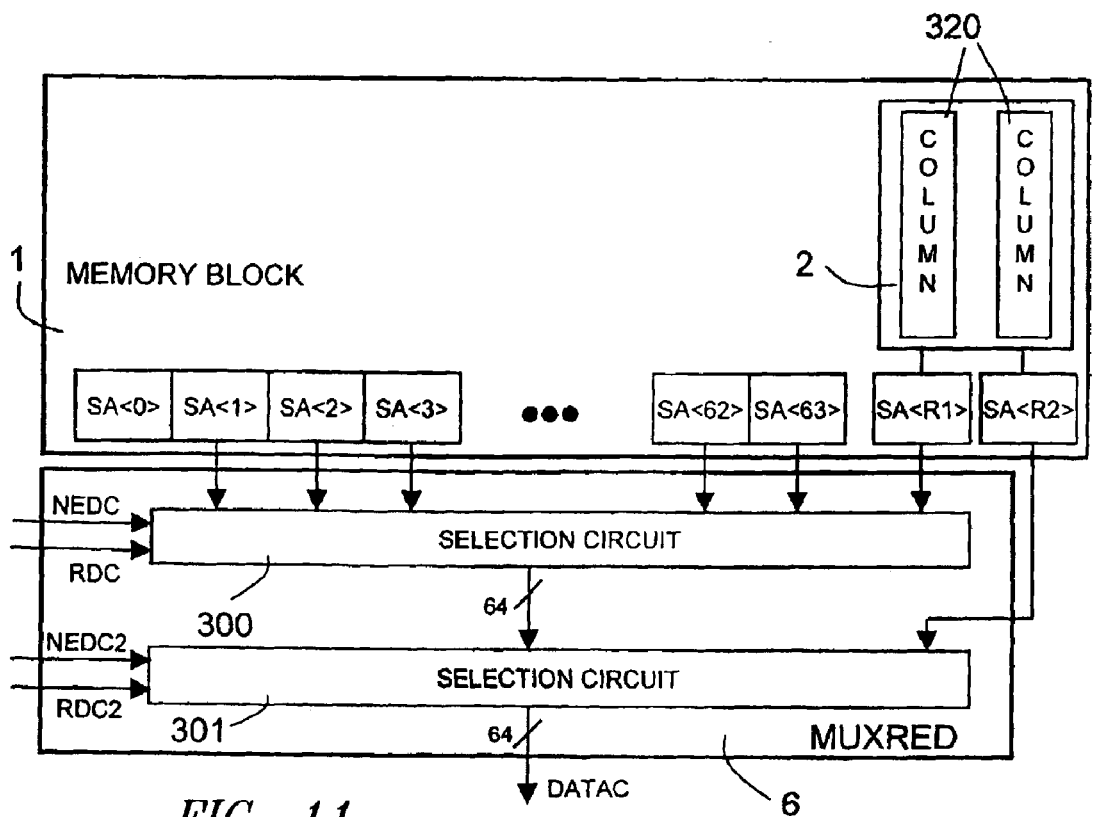
FIG. 11 shows a variant of the detail of FIG. 10.

If it is desired to be able to replace a second bit in a same word, it is possible to add a second redundancy sense amplifier and a second selection circuit, as illustrated in FIG. 11.

In detail, a second selection circuit 301 is cascade connected to the first selection circuit 300 and receives the bits outputted by the first selection circuit 300 and by a second redundancy sense amplifier SA<R2>; moreover, the second selection circuit 301 receives an own redundancy activation signal NEDC2 and the address RDC2 of the second cell to be replaced.

In this case, in addition to the replacement carried out by the first selection circuit 300, the second selection circuit 301 can carry out a second replacement of one of the bits received from the first selection circuit 300 with the output of the second redundancy sense amplifier SA<R2>. Also in this case, there is no access delay.

Of course, by providing further redundancy sense amplifiers and further selection circuits, and hence with an increase in complexity, it is possible to correct more than two bits.

2.2 Auxiliary Array Sector

According to this solution, in the memory array a small auxiliary sector is present, the rows of which are designed to store entire corrected words, which replace incorrect words in the standard sectors of the memory.

According to a first possibility, the auxiliary sector has a number of rows proportional to the number of sectors of the memory array, and each row (or each group of rows) of the auxiliary matrix is associated rigidly to an own sector. In this case, the memory architecture is similar to the one of FIG. 1, with the difference that the redundancy multiplexer 6 is not present (at least as regards in-field redundancy) and the outputs of the portion 5a of the UPROM bank 5 are supplied directly to the memory block 1, so that, when a row containing one or more non-functioning cells is to be read, the row corresponding to the auxiliary sector is automatically addressed.

Figure 12:
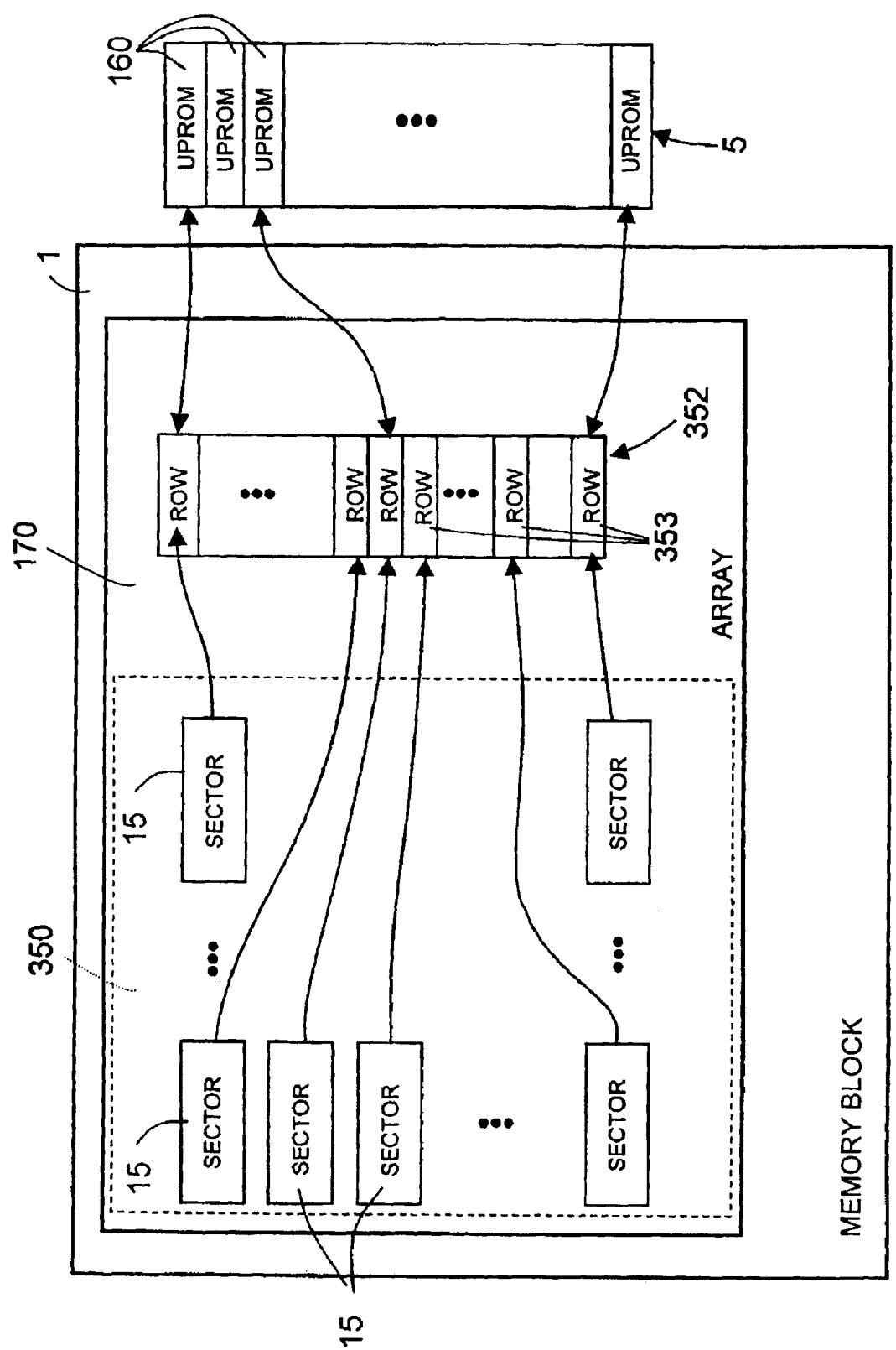
FIG. 12 shows a block diagram of a part of the memory of FIG. 1.

The above solution is illustrated schematically in FIG. 12, were the memory block 1 comprises a memory array 170 made up of a standard portion 350 comprising a plurality of standard sectors 15 and of an auxiliary sector 352 (which constitutes the redundancy portion 2 of FIG. 1) comprising a plurality of rows 353.

Each standard sector 15 is here rigidly associated to a row 353 of the auxiliary sector 352. The row 353 stores the content of one of the rows of the standard sector 15 associated thereto, when an error is detected following upon a programming or erasing operation.

In this case, the UPROM bank 5 of FIG. 1 comprises a number of UPROMs 160 equal to the number of rows 353 of the auxiliary sector (and hence of standard sectors 15) and each UPROM 160 stores the address of the replaced row of the standard sector 15 and a guard bit which stores the information on whether redundancy has or has not been activated. Here, the term UPROM indicates the set of memory elements and of the corresponding biasing and reading circuits which store the address information and the guard bit. The UPROMs 160 may moreover have the parallel organization illustrated in FIG. 4 or the matrix organization illustrated in FIG. 5.

Erasing of the auxiliary sector 352 in this case must be carried out by rows; in fact, when a standard sector 15 is erased, also the row 353 of the auxiliary sector 352 associated thereto must be erased.

Alternatively, no rigid association between the standard sectors 15 and the rows 353 of the auxiliary sector 352 exists. Instead, the UPROMs 160 are rigidly associated to the rows of the auxiliary sector. In this case, in each UPROM 160 of the UPROM bank 5 not only the address of the row to be replaced and the guard bit are stored, but also the address of the standard sector 15 is stored, which contains the row to be replaced.

Also in this case, erasing of the auxiliary sector is performed according to the single-row procedure.

2.3 Column/Row Redundancy

Another possibility consists in providing a column redundancy of a standard type, as is currently used for the redundancy activated during EWS, in which the possible column in which an erroneous bit is detected during verification in the programming step is replaced by an entire column intended for redundancy uses. Alternatively, a row redundancy may be provided.

The above solution entails long writing times, but can be used in applications where time is not a critical factor.

2.4 Sector Redundancy

As pointed out above, also for programming, a sector redundancy can be used like the one described for the erasing operation, with reference to FIGS. 4–8.

The method and architectures described herein enable in-field self-repair of the memory during normal operation after an erasing or programming operation, when, after a standard maximum number of erasing/programming pulses has been supplied, it has not been possible to store a datum correctly, so overcoming the need to consider the memory device failed and hence to be replaced. This enables a considerable increase in the life of the memory, with consequent considerable savings in terms of costs.

The self-repair method and architecture described herein can in any case be applied also in the EWS-testing step in the factory with the aim of simplifying its flow. In particular, the memory device could generate by itself the various patterns to be used for verifying its functionality and then proceed, once again by itself, to the correction. The possibility of application, during EWS, proves for example advantageous in those cases where the standard testing is very costly or complicated, for instance in devices used for storing images. In such cases, in fact, frequently the EWS test is not implemented, and it is not possible to discriminate failed devices that cannot be self-repaired from correctly functioning devices that can be self-repaired.

Finally, it is clear that numerous modifications and variations may be made to the self-repair method and to the memory device described and illustrated herein, all of which fall within the scope of the present invention, as defined in the attached claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A self-repair method for a nonvolatile memory including a memory array having a plurality of sectors and a redundancy portion, said sectors being made up of a plurality of memory cells arranged in memory lines, each of which stores a datum, said method comprising the steps of:

performing a modification operation of data of said memory cells, said modification operation being chosen between programming and erasing;

verifying the correctness of the data of said memory cells;

if said verification step has revealed a non-functioning cell, redunding said non-functioning cell by activating said redundancy portion and storing redundancy data in nonvolatile memory elements, wherein said redundancy data comprise at least part of an address of said non-functioning cell and a redundancy-activated flag.

2. The method according to claim 1 wherein, after said step of redunding, the step of verifying the redundancy data is performed.

3. A self-repair method for a nonvolatile memory including a memory array having a plurality of sectors and a redundancy portion, said sectors being made up of a plurality of memory cells arranged in memory lines, each of which stores a datum, said method comprising the steps of:

performing a modification operation of data of said memory cells, said modification operation being chosen between programming and erasing;

verifying the correctness of the data of said memory cells;

if said verification step has revealed a non-functioning cell, redunding said non-functioning cell by activating said redundancy portion and storing redundancy data in nonvolatile memory elements, wherein said step of verifying the correctness of the data of said memory cells comprises the steps of:

determining the number of memory cells or memory lines storing an incorrect datum;

if said number of memory cells or memory lines storing said incorrect datum is less than or equal to a threshold value, activating said step of redunding.

4. The method according to claim 3 wherein, after said step of redunding, the step of verifying the redundancy data is performed.

5. A self-repair method for a nonvolatile memory including a memory array having a plurality of sectors and a redundancy portion, said sectors being made up of a plurality of memory cells arranged in memory lines, each of which stores a datum, said method comprising the steps of:

performing a modification operation of data of said memory cells, said modification operation being chosen between programming and erasing;

verifying the correctness of the data of said memory cells;

if said verification step has revealed a non-functioning cell, redunding said non-functioning cell by activating said redundancy portion and storing redundancy data in nonvolatile memory elements, wherein, after said step of redunding, the step of verifying the redundancy data is performed.

6. The method according to claim 5 wherein, if said step of verifying said redundancy data yields a result indicating an error, an error signal is generated.

7. A self-repair method for a nonvolatile memory including a memory array having a plurality of sectors and a redundancy portion, said sectors being made up of a plurality of memory cells arranged in memory lines, each of which stores a datum, said method comprising the steps of:

performing a modification operation of data of said memory cells, said modification operation being chosen between programming and erasing;

verifying the correctness of the data of said memory cells;

if said verification step has revealed a non-functioning cell, redunding said non-functioning cell by activating said redundancy portion and storing redundancy data in nonvolatile memory elements, wherein said memory cells are arranged in rows and columns, said modification operation is an erasing operation, said step of verifying the correctness is performed after said erasing operation, and said step of storing redundancy data comprises storing an address of at least one column part of said memory array containing said non-functioning cell.

8. The method according to claim 7 wherein, after said step of redunding, the step of verifying the redundancy data is performed.

9. A self-repair method for a nonvolatile memory including a memory array having a plurality of sectors and a redundancy portion, said sectors being made up of a plurality of memory cells arranged in memory lines, each of which stores a datum, said method comprising the steps of:

performing a modification operation of data of said memory cells, said modification operation being chosen between programming and erasing;

verifying the correctness of the data of said memory cells;

if said verification step has revealed a non-functioning cell, redunding said non-functioning cell by activating said redundancy portion and storing redundancy data in nonvolatile memory elements, wherein said modification operation is an erasing operation, said step of verifying the correctness is performed before said erasing operation, and said step of storing redundancy data comprises storing an address of at least one row containing said non-functioning cell.

10. The method according to claim 9 wherein said step of verifying the correctness of the data comprises the steps of:

carrying out a short-circuit test on a first row of one of the sectors;

if said short-circuit test yields a positive result, performing said step of redunding; and if said short-circuit test yields a negative result, repeating said short-circuit test on said first row and on at least one further row close to said first row until said short-circuit test yields a positive result or until redundancy resources are all used up.

11. The method according to claim 10 wherein said step of repeating comprises performing said short-circuit test on a preset packet of rows including said first row and said further row.

12. A self-repair method for a nonvolatile memory including a memory array having a plurality of sectors and a redundancy portion, said sectors being made up of a plurality of memory cells arranged in memory lines, each of which stores a datum, said method comprising the steps of:

performing a modification operation of data of said memory cells, said modification operation being chosen between programming and erasing;

verifying the correctness of the data of said memory cells;

if said verification step has revealed a non-functioning cell, redunding said non-functioning cell by activating said redundancy portion and storing redundancy data in nonvolatile memory elements, wherein said modification operation is a programming operation performed on a plurality of memory cells storing a memory word, and said step of redunding comprises writing correct data in said redundancy portion.

13. The method according to claim 12 wherein said redundancy portion comprises at least one redundancy line, said step of writing correct data comprises programming a single cell of said redundancy line, and said step of storing redundancy data comprises writing an address of said non-functioning cell in said nonvolatile memory elements.

14. A self-repair method for a nonvolatile memory including a memory array having a plurality of sectors and a redundancy portion, said sectors being made up of a plurality of memory cells arranged in memory lines, each of which stores a datum, said method comprising the steps of:

performing a modification operation of data of said memory cells, said modification operation being chosen between programming and erasing;

verifying the correctness of the data of said memory cells;

if said verification step has revealed a non-functioning cell, redunding said non-functioning cell by activating said redundancy portion and storing redundancy data in nonvolatile memory elements, wherein said modification operation is activated during an EWS-testing step.

15. The method according to claim 14 wherein, after said step of redunding, the step of verifying the redundancy data is performed.

16. A self-repair method for a nonvolatile memory including a memory array having a plurality of sectors and a redundancy portion, said sectors being made up of a plurality of memory cells arranged in memory lines, each of which stores a datum, said method comprising the steps of:

performing a modification operation of data of said memory cells, said modification operation being chosen between programming and erasing;

verifying the correctness of the data of said memory cells;

if said verification step has revealed a non-functioning cell, redunding said non-functioning cell by activating said redundancy portion and storing redundancy data in nonvolatile memory elements, wherein said modification operation is activated during a step of normal in-field use of said nonvolatile memory.

17. The method according to claim 16 wherein, after said step of redunding, the step of verifying the redundancy data is performed.

18. A nonvolatile memory device, comprising:
a memory block comprising a memory array including a plurality of sectors and a redundancy portion, said sectors being made up of a plurality of memory cells arranged in memory lines, each of which stores a base datum, and said redundancy portion being made up of a plurality of memory cells, each of which stores a redundancy datum;
modification means for modifying the data of said memory cells, said modification means performing an operation chosen between programming and erasing;
a correctness verifying circuit of the data of said memory cells, said correctness verifying circuit being enabled by said modification means and generating an incorrect-datum signal if a non-functioning cell is detected; and
redundancy activating means connected to said correctness verifying circuit, said redundancy-activation means enabling said redundancy portion and storing redundancy data in a redundancy memory stage in the presence of said incorrect-datum signal.

19. The device according to claim 18 wherein said redundancy portion comprises a plurality of columns or rows or redundancy sectors.

20. The device according to claim 18 wherein said sectors are arranged in sector rows and columns and said redundancy portion comprises a plurality of redundancy sectors, at least one for each sector, each redundancy sector being configured to store the contents of an entire sector containing said non-functioning cell.

21. The device according to claim 20, wherein the memory block includes a first redundancy sector and a second redundancy sector associated with a respective sector column, said memory array being divided into a first half and a second half, said memory block further comprising a column decoder arranged between said first half and said second half of said memory array, said first and second redundancy sectors of each sector column being set along said sector column, in said first half and said second half, respectively.

22. The device according to claim 18 wherein said redundancy memory stage comprises a plurality of memory units, each of which stores an address information of said non-functioning cell and an activated-redundancy flag.

23. The device according to claim 22 wherein said memory units are UPROMs.

24. The device according to claim 22 wherein said memory units are arranged in parallel and each comprises:
a plurality of nonvolatile memory elements having a common control terminal;
a biasing and read/write logic circuit connected to an output terminal of said plurality of nonvolatile memory elements; and
a plurality of temporary memory elements, one for each nonvolatile memory element, said temporary memory elements each having a redundancy output supplying redundancy information.

25. The device according to claim 24, comprising a single control line connected to said control terminals of all said nonvolatile memory elements.

26. The device according to claim 24 wherein said sectors are arranged in sector rows and columns and said redundancy portion comprises a plurality of redundancy sectors, at least one for each sector, each redundancy sector being configured to store the contents of an entire sector containing said non-functioning cell, wherein said address information is an address of a redunded row, indicating a sector row containing said non-functioning cell, the device further comprising:
a redundancy decoder which receives a sector-column address and generates a redundancy-selection signal;
a selection stage having a plurality of data inputs connected to said redundancy outputs and a selection input receiving said redundancy-selection signal, said selection stage having an output supplying one of said address information according to said redundancy-selection signal; and
a sector-row decoder, which receives a sector-row address and includes a redundancy-activation-verification circuit, connected to said output of said selection stage, said sector-row decoder generating a sector-row-addressing signal, in the event of said address information being different from said sector-row address or in the event of said activated-redundancy flag having a deactivation value, and generating an activation signal of said redundancy sectors, in the event of said address information being the same as said sector-row address and in the event of said activated-redundancy flag having an activation value.

27. The device according to claim 22 wherein said memory units are arranged in matrix configuration and comprise a plurality of nonvolatile memory elements, which form an array and have control terminals connected to a plurality of control lines and output terminals connected to a plurality of bitlines, said device further comprising:
a driving circuit which receives a control-line-addressing signal and drives said control lines; and
a biasing and read/write logic circuit connected to said bitlines and having an output which supplies said address information and said activated-redundancy flag.

28. The device according to claim 27 wherein said sectors are arranged in sector rows and columns and said redundancy portion comprises a plurality of redundancy sectors, at least one for each sector, each redundancy sector being configured to store the contents of an entire sector containing said non-functioning cell, wherein said address information is an address of a redunded row, indicating a sector row containing said non-functioning cell, the device further comprising:
a redundancy decoder which receives a sector-column address and generates a control-line-addressing signal; and
a sector-row decoder, which receives a sector-row address and includes a redundancy-activation-verification circuit connected to said output of said biasing and read/write logic circuit, said sector-row decoder generating a sector-row-addressing signal, in the event of said address information being different from said sector-row address or in the event of said activated-redundancy flag having a deactivation value, and generating an activation signal of said redundancy sectors, in the event of said address information being the same as said sector-row address and in the event of said activated-redundancy flag having an activation value.

29. The device according to claim 22 wherein said redundancy portion comprises an auxiliary sector formed by a plurality of rows, each row of said auxiliary sector being associated with a respective one of said memory units.

30. The device according to claim 29 wherein each row of said auxiliary sector) is associated with a preset respective one of said standard sectors, and the address information stored in each memory unit comprises a row address, which identifies a row of the standard sector associated with the respective row of said auxiliary sector.

31. The device according to claim 29 wherein each of said address information comprises a sector address and a row address, said sector address identifying one among said sectors, and said row address identifying one row of said one among said sectors.

32. The device according to claim 18 wherein said redundancy data comprise a first address and one first activation signal, the device further comprising:
   a plurality of read devices, connected to said sectors, for reading word bits;
   a first redundancy-read device connected to a first redundancy column of said redundancy portion; and
   a first selection circuit having first inputs and first outputs, said first inputs being connected to said read devices for reading word bits, and to said first redundancy-read device, said first selection circuit receiving said first address and said first activation signal and connecting said first outputs to said read devices for reading word bits except for one, and to said first redundancy-read device in the presence of said first activation signal and upon command of said first address.

33. The device according claim 28 wherein said redundancy data comprise a second address and one second activation signal, the device further comprising:
   a second redundancy-read device connected to a second redundancy column of said redundancy portion; and
   a second selection circuit having second inputs and second outputs, said second inputs being connected to said first outputs and to said second redundancy-read device, said second selection circuit receiving said second address and said second activation signal and connecting said second outputs to said first outputs except for one, and to said second redundancy-read device in the presence of said second activation signal and upon command of said second address.

34. A nonvolatile memory device, comprising:
   a memory array including a plurality of memory sectors made up of a plurality of memory cells arranged in memory lines, each of which stores a base datum, the memory sectors being arranged in sector rows and columns;
   a correctness verifying circuit structured to verify the data of the memory cells, the correctness verifying circuit generating an incorrect-datum signal if a non-functioning cell is detected;
   redundancy memory portion having a plurality of redundancy sectors made up of a plurality of memory cells, each of which stores a redundancy datum, each redundancy sector being configured to store contents of an entire memory sector containing the non-functioning cell; and
   a redundancy memory stage that stores redundancy information linking the memory sector containing the non-functioning cell to a replacement sector of the redundancy sectors.

35. The device according to claim 34, wherein the redundancy memory portion includes a first redundancy sector and a second redundancy sector associated with respective sector columns, the memory array being divided into a first half and a second half, the device further comprising a column decoder arranged between the first half and the second half of the memory array, the first and second redundancy sectors of each sector column being set along the sector column, in the first half and the second half, respectively.

36. The device according to claim 34 wherein the redundancy memory stage comprises a plurality of memory units, each of which stores an address of the non-functioning cell and an activated-redundancy flag.

37. The device according to claim 36 wherein the memory units are arranged in parallel and each comprises:
   a plurality of nonvolatile memory elements having a common control terminal;
   a biasing and read/write logic circuit connected to an output terminal of the plurality of nonvolatile memory elements; and
   a plurality of temporary memory elements, one for each nonvolatile memory element, the temporary memory elements each having a redundancy output supplying redundancy information.

38. The device according to claim 36 wherein the redundancy portion comprises an auxiliary sector formed by a plurality of rows, each row of the auxiliary sector being associated with a respective one of the memory units.

39. The device according to claim 34 wherein the memory sectors are arranged in sector rows and columns, wherein the information is an address of a redunded row, indicating a sector row containing the non-functioning cell, the device further comprising:
   a redundancy decoder which receives a sector-column address and generates a redundancy-selection signal;
   a selection stage having a plurality of data inputs connected to the redundancy outputs and a selection input receiving the redundancy-selection signal, the selection stage having an output supplying the address according to the redundancy-selection signal; and
   a sector-row decoder, which receives a sector-row address and includes a redundancy-activation-verification circuit, connected to the output of the selection stage, the sector-row decoder generating a sector-row-addressing signal, in the event of the address being different from the sector-row address or in the event of an activated-redundancy flag having a deactivation value, and generating an activation signal of the redundancy sectors, in the event of the address being the same as the sector-row address and in the event of the activated-redundancy flag having an activation value.

40. The device according to claim 34 wherein the redundancy information comprise a first address and a first activation signal, the device further comprising:
   a plurality of read devices, connected to the memory sectors, for reading word bits;
   a first redundancy-read device connected to a first redundancy column of the redundancy portion; and
   a first selection circuit having first inputs and first outputs, the first inputs being connected to the read devices for reading word bits, and to the first redundancy-read device, the first selection circuit receiving the first address and the first activation signal and connecting the first outputs to the read devices for reading word bits except for one, and to the first redundancy-read device in the presence of the first activation signal and upon command of the first address.

41. The device according claim 40 wherein the redundancy information comprises a second address and one second activation signal, the device further comprising:

a second redundancy-read device connected to a second redundancy column of the redundancy portion; and a second selection circuit having second inputs and second outputs, the second inputs being connected to the first outputs and to the second redundancy-read device, the second selection circuit receiving the second address and the second activation signal and connecting the second outputs to the first outputs except for one, and to the second redundancy-read device in the presence of the second activation signal and upon command of the second address.

* * * * *

UNITED STATES PATENT AND TRADEMARK OFFICE
CERTIFICATE OF CORRECTION

| | |
|---|---|
| PATENT NO. | : 6,944,072 B2 |
| DATED | : September 13, 2005 |
| INVENTOR(S) | : Rino Micheloni et al. |

It is certified that error appears in the above-identified patent and that said Letters Patent is hereby corrected as shown below:

Column 19,
Line 30, "claim 28" should read -- claim 32 --.

Signed and Sealed this

Fourth Day of April, 2006

JON W. DUDAS
*Director of the United States Patent and Trademark Office*